(12) United States Patent
Hwang et al.

(10) Patent No.: US 10,282,167 B2
(45) Date of Patent: May 7, 2019

(54) BUFFER, SEMICONDUCTOR APPARATUS AND SEMICONDUCTOR SYSTEM USING THE SAME

(71) Applicant: SK hynix Inc., Icheon-si, Gyeonggi-do (KR)

(72) Inventors: Jin Ha Hwang, Icheon-si Gyeonggi-do (KR); Dae Han Kwon, Icheon-si Gyeonggi-do (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 508 days.

(21) Appl. No.: 14/940,309

(22) Filed: Nov. 13, 2015

(65) Prior Publication Data

US 2017/0031653 A1 Feb. 2, 2017

(30) Foreign Application Priority Data

Jul. 27, 2015 (KR) .................. 10-2015-0105865

(51) Int. Cl.
| | |
|---|---|
| *G06F 5/14* | (2006.01) |
| *G11C 29/00* | (2006.01) |
| *G11C 5/02* | (2006.01) |
| *G11C 29/44* | (2006.01) |
| *G11C 7/10* | (2006.01) |
| *G11C 7/02* | (2006.01) |
| *G11C 7/22* | (2006.01) |

(52) U.S. Cl.
CPC ................ *G06F 5/14* (2013.01); *G11C 5/025* (2013.01); *G11C 7/02* (2013.01); *G11C 7/1093* (2013.01); *G11C 7/22* (2013.01); *G11C 29/4401* (2013.01); *G11C 29/76* (2013.01); *G06F 2205/126* (2013.01)

(58) Field of Classification Search
CPC ........... G08C 13/00; G01D 5/00; G01N 33/49
USPC ......................................................... 710/53
See application file for complete search history.

(56) References Cited

U.S. PATENT DOCUMENTS

| | | | |
|---|---|---|---|
| 6,255,883 B1* | 7/2001 | Delvaux ................... | G06F 1/10 326/30 |
| 9,277,421 B1* | 3/2016 | Petrovic ................. | H04B 15/00 |
| 9,805,919 B1* | 10/2017 | Hanks ............... | H01J 37/32935 |
| 2002/0051546 A1* | 5/2002 | Bizjak .................. | H03G 3/3089 381/106 |
| 2003/0125922 A1* | 7/2003 | Grochowski ............. | G06F 1/26 703/18 |
| 2005/0186933 A1 | 8/2005 | Trans | |

(Continued)

*Primary Examiner* — Benjamin P Geib
*Assistant Examiner* — Getente A Yimer
(74) *Attorney, Agent, or Firm* — William Park & Associates Ltd.

(57) ABSTRACT

A buffer may include a first sensing unit configured to sense data, and a second sensing unit configured to generate equalization control signals according to outputs of the first sensing unit. The buffer may include an equalization delay compensation unit configured to compensate the equalization control signals for signal processing delay times of the equalization control signals, and generate delay-compensated equalization control signals. The buffer may include a noise removal unit configured to primarily remove noise of the output signals of the first sensing unit according to the equalization control signals, and secondarily remove noise of the output signals of the first sensing unit according to the delay-compensated equalization control signals.

21 Claims, 4 Drawing Sheets

(56) References Cited

U.S. PATENT DOCUMENTS

| | | | |
|---|---|---|---|
| 2010/0168538 A1* | 7/2010 | Keenan | A61B 5/0031 600/365 |
| 2011/0185820 A1* | 8/2011 | Henry | G01F 1/8427 73/861 |
| 2013/0193507 A1* | 8/2013 | Yoshida | G11C 11/4091 257/329 |

* cited by examiner

BUFFER, SEMICONDUCTOR APPARATUS AND SEMICONDUCTOR SYSTEM USING THE SAME

CROSS-REFERENCES TO RELATED APPLICATION

The present application claims priority under 35 U.S.C. § 119(a) to Korean application number 10-2015-0105865, filed on Jul. 27, 2015, in the Korean Intellectual Property Office, which is incorporated herein by reference in its entirety.

BACKGROUND

1. Technical Field

Various embodiments generally relate to a semiconductor circuit, and, more particularly, to a buffer, a semiconductor apparatus and a semiconductor system using the same.

2. Related Art

In a semiconductor apparatus, intersymbol interference (ISI) occurs during a signal transmission process, and accordingly, signal transmission efficiency is likely to deteriorate.

Therefore, as a method for overcoming deterioration of signal transmission efficiency due to ISI, an input buffer having an equalization function may be used.

SUMMARY

In an embodiment, a buffer may be provided. The buffer may include a first sensing unit configured to sense data. The buffer may include a second sensing unit configured to generate equalization control signals according to outputs of the first sensing unit. The buffer may include an equalization delay compensation unit configured to compensate the equalization control signals for signal processing delay times of the equalization control signals, and generate delay-compensated equalization control signals. The buffer may include a noise removal unit configured to primarily remove noise of the output signals of the first sensing unit according to the equalization control signals, and secondarily remove noise of the output signals of the first sensing unit according to the delay-compensated equalization control signals.

In an embodiment, a semiconductor apparatus may be provided. The semiconductor apparatus may include a core block including a cell array. The semiconductor apparatus may include a first buffer configured to sense data, primarily remove noise of sensed signals according to equalization control signals, and secondarily remove noise of the sensed signals according to delay-compensated equalization control signals. The semiconductor apparatus may include a data path coupled with the first buffer, and a second buffer configured to sense a data strobe signal. The semiconductor apparatus may include a strobe signal path coupled with the second buffer. The semiconductor apparatus may include a latch block configured to latch data having passed through the data path, according to the data strobe signal having passed through the strobe signal path, and provide resultant data to the core block.

In an embodiment, a buffer may be provided. The buffer may include a first sensing unit configured to sense data, and a second sensing unit configured to generate equalization control signals according to outputs of the first sensing unit. The buffer may include an equalization delay compensation unit configured to generate delay-compensated equalization control signals by compensating the equalization control signals for signal processing delay times of the equalization control signals. The buffer may include a noise removal unit configured to remove noise of the output signals of the first sensing unit according to the equalization control signals and the delay-compensated equalization control signals.

DETAILED DESCRIPTION

Hereinafter, a system, a buffer, a semiconductor apparatus and a semiconductor system using the same will be described below with reference to the accompanying drawings through various examples of embodiments.

Various embodiments may be directed to a buffer, a semiconductor apparatus and a semiconductor system using the same, capable of removing noise of an input signal.

Figure 1:
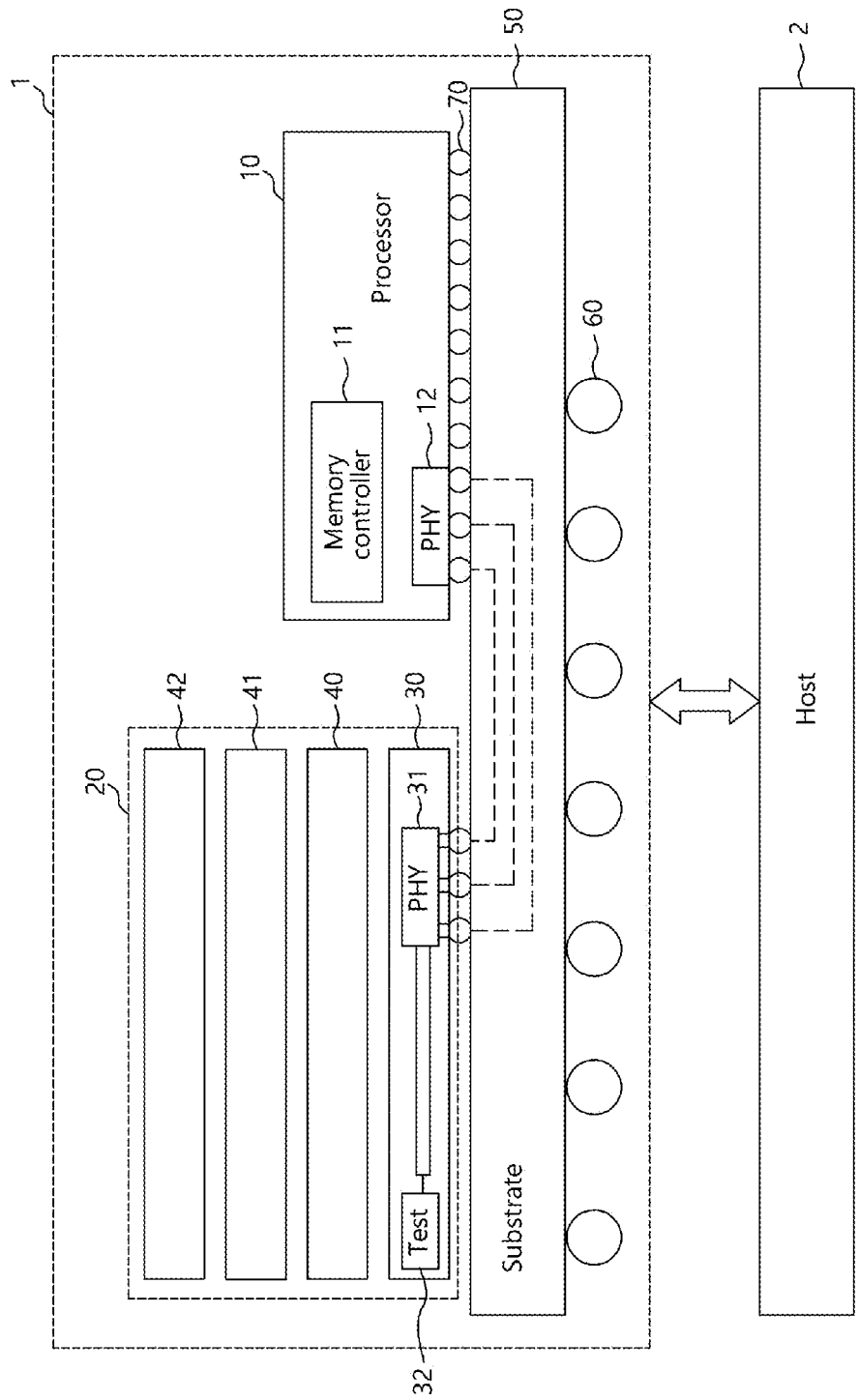
FIG. 1 is a diagram illustrating a representation of an example of the configuration of a semiconductor system 1 in accordance with an embodiment.

Referring to FIG. 1, a semiconductor system 1 in accordance with an embodiment may include a substrate 50, a stacked semiconductor memory 20, and a processor 10.

The semiconductor system 1 may be realized in a system-in-package type, a multi-chip package type or a system-on-chip type, and may be realized in a package-on-package type including a plurality of packages.

The substrate 50 may provide signal paths for smooth data communication or data communication between the processor 10 and the stacked semiconductor memory 20. The substrate 50 may include an additional logic circuit for providing the signal paths and a logic circuit for a test.

The substrate 50 may be realized in various types, such as, for example but not limited to, an interposer and a PCB (printed circuit board). The signal paths provided by the substrate 50 may include electrical coupling paths such as metal layers or through-silicon vias.

The substrate 50 may be electrically coupled with an external device through package balls 60 such as, for example but not limited to, a ball grid array, bump balls and C4 bumps. The external device may be, for example but not limited to, a host 2. The host may operate by being coupled with the semiconductor system 1.

The substrate 50 may be electrically coupled with the processor 10 and the stacked semiconductor memory 20 through, for example but not limited to, micro bumps 70.

The processor 10 may communicate with the host 2 through a system bus (not illustrated) and the substrate 50, and may perform various calculation operations required by the host 2.

The processor 10 may include at least one among a central processing unit (CPU), a graphic processing unit (GPU), a multimedia processor (MMP) and a digital signal processor (DSP).

The processor 10 may be realized in, for example but not limited to, a system-on-chip type, a system-in-package type and a package-on-package type in which processor chips having various functions, such as application processors (AP), are combined.

The processor 10 may access the stacked semiconductor memory 20 through a memory controller 11.

A physical layer PHY 12 of the memory controller 11 and a physical layer PHY 31 of the stacked semiconductor memory 20 may convert signals to be exchanged between them, in conformity with the interface between them.

While the present embodiment illustrates an example in which the memory controller 11 is disposed in the processor 10, it is to be noted that, as the case may be, the memory controller 11 may be separately disposed outside the processor 10.

The memory controller 11 may be stacked as any one chip (a base chip or a logic chip) of the stacked semiconductor memory 20.

The memory controller 11 may be separately stacked on the substrate 50 by being separated from the stacked semiconductor memory 20 and the processor 10.

The memory controller 11 may provide, for example but not limited to, a command, an address, a clock and data to the stacked semiconductor memory 20 to control the stacked semiconductor memory 20, and may receive data outputted from the stacked semiconductor memory 20.

The physical layers 12 and 31 may be interface circuits which convert a signal transmitted from the processor 10 or the memory controller 11 into a signal appropriate to be used in the stacked semiconductor memory 20 and output the converted signal or which convert a signal transmitted from the stacked semiconductor memory 20 into a signal appropriate to be used in the processor 10 or the memory controller 11.

The stacked semiconductor memory 20 may be a stacked memory device including a plurality of stacked chips.

The stacked semiconductor memory 20 may include a logic chip 30 and a plurality of memory chips 40, 41, and 42 which are sequentially stacked on the logic chip 30. However, the embodiments are not limited in this manner and one or more stacked semiconductor memories may be provided including one or more logic chips and one or more memory chips.

The logic chip 30 and the plurality of memory chips 40 to 42 may be electrically coupled through, for example but not limited to, vias TSV or bonding wires.

The logic chip 30 may relay signal and data transmission between the memory controller 11 and the plurality of memory chips 40 to 42.

The logic chip 30 may include, for example but not limited to, the physical layer 31, a test circuit 32 and a repair-related circuit (not illustrated).

The physical layer 31 may receive a signal and data transmitted through the processor 10 or the memory controller 11 and the physical layer 12, and may amplify signals and data outputted from the plurality of memory chips 40 to 42 and transmit the amplified signals and data to the physical layer 12.

The test circuit 32 may perform tests for the plurality of memory chips 40 to 42 by being coupled with the processor 10 or the memory controller 11, or may perform tests for the plurality of memory chips 40 to 42 by being coupled with the host 2, for example but not limited to, test equipment. The test circuit 32 may independently perform a test for the stacked semiconductor memory 20.

The test circuit 32 may include circuits which may perform tests associated with the plurality of memory chips 40 to 42 and the logic chip 30 at a wafer level and a package level.

The test circuit 32 may include various memory test-related circuits such as, for example but not limited to, a built-in self test circuit, a self repair circuit and a self stress circuit.

The test circuit 32 may perform, for example but not limited to, a couplability test of the through vias or micro bumps, a boundary scan test, a burn-in stress test, a data input/output test, a data compression test, and so on.

The test circuit 32 may include a repair logic which replaces a failed memory cell with a redundancy memory cell.

The plurality of memory chips 40 to 42 may respectively have data storage spaces for storing data transmitted through the logic chip 30 from the processor 10 or the memory controller 11.

The plurality of memory chips 40 to 42 may further include logic circuits for performing tests in link with the test circuit 32 of the logic chip 30.

The logic chip 30 and the plurality of memory chips 40 to 42 may be configured with, for example, a DRAM or a NAND flash.

While it is illustrated as an example that the stacked semiconductor memory 20 is configured by 4 chips, that is, the logic chip 30 and the plurality of memory chips 40 to 42 which are sequentially stacked on the logic chip 30, it is to be noted that an increased number of chips may be stacked.

Each of the chips of the stacked semiconductor memory 20 may be configured with, for example, a DRAM or a NAND flash.

Each of the chips of the stacked semiconductor memory 20 may include an input buffer for compensating for deterioration in performance for sensing an input signal.

In the example where a plurality of chips are stacked as illustrated in FIG. 1, noise, in particular, intersymbol interference (ISI), of an input signal may increase. For example, tail ISI as a residual component of ISI, that is, the fall time slope of ISI may worsen, and this may resultantly serve as a factor that deteriorates input signal sensing performance.

An embodiment may use an input buffer having an equalization function by using an IIR filter such that it may be possible to compensate for deterioration in input signal sensing performance due to noise, in particular, ISI.

Figure 2:
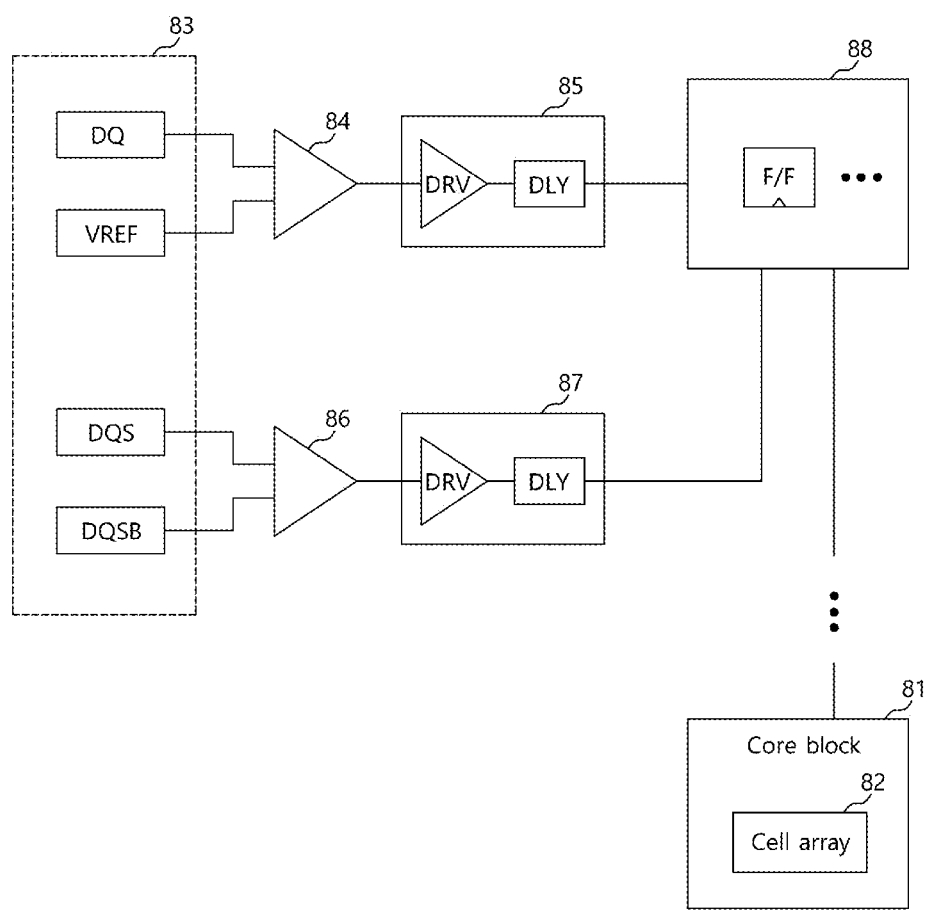
FIG. 2 is a diagram illustrating a representation of an example of the configuration of a semiconductor apparatus 80 in accordance with an embodiment.

The logic chip 30 or each of the plurality of memory chips 40 to 42 in the stacked semiconductor memory 20 of FIG. 1 may be configured in the same way or substantially the same way as a semiconductor apparatus 80 of FIG. 2.

Referring to FIG. 2, the semiconductor apparatus 80 in accordance with an embodiment may include a core block 81, a pad array 83, first and second buffers 84 and 86, a data path 85, a strobe signal path 87, and a latch block 88.

The core block 81 may include a cell array 82 and row paths and column paths for writing data in the cell array 82 and reading out data from the cell array 82.

The cell array 82 may be divided into unit memory blocks of a small unit, for example, mats, or unit memory blocks of a large unit, for example, banks.

The pad array 83 may include pads for data DQ, a reference voltage VREF and data strobe signals DQS and DQSB.

The first buffer 84 may sense/amplify the data DQ according to the reference voltage VREF provided through the pad array 83, and output resultant data.

The data path 85 may include a driver DRV for driving the output of the first buffer 84 and a delay DLY.

The second buffer 86 may sense/amplify the data strobe signals DQS and DQSB provided through the pad array 83, and output resultant signals.

The strobe signal path 87 may include a driver DRV for driving the output of the second buffer 86 and a delay DLY.

The latch block 88 may latch the data DQ having passed through the data path 85, according to the data strobe signal DQS having passed through the strobe signal path 87, or arrange latched signals and provide resultant signals to the core block 81.

The latch block 88 may include a plurality of flip-flops F/F.

The first buffer 84 or the second buffer 86 may be configured to have an equalization function.

The semiconductor apparatus 80 in accordance with an embodiment may be a matched delay type.

In the matched delay type, circuit design is implemented such that the data DQ and the data strobe signal DQS are provided at the same time to the latch block 88 and/or provided with the same timing to the latch block 88.

By controlling the delay times of the respective delays DLY of the data path 85 and the strobe signal path 87, it is possible to cause the data DQ and the data strobe signal DQS to be provided at the same time to the latch block 88 and/or provided with the same timing to the latch block 88.

The matched delay type may be applied to a semiconductor memory.

In the example where the first buffer 84 is configured to have an equalization function, a filter for realizing the equalization function may be used.

In this regard, in the matched delay type, it may be difficult to apply an IIR (infinite impulse response) filter. However, in the semiconductor apparatus 80 in accordance with an embodiment, by applying an IIR filter through using an equalization delay compensation function as will be described later, it may be possible to remove ISI including tail ISI.

Therefore, the first buffer 84 may be built with an IIR filter, and may be configured to perform an equalization function by using the IIR filter.

Figure 3:
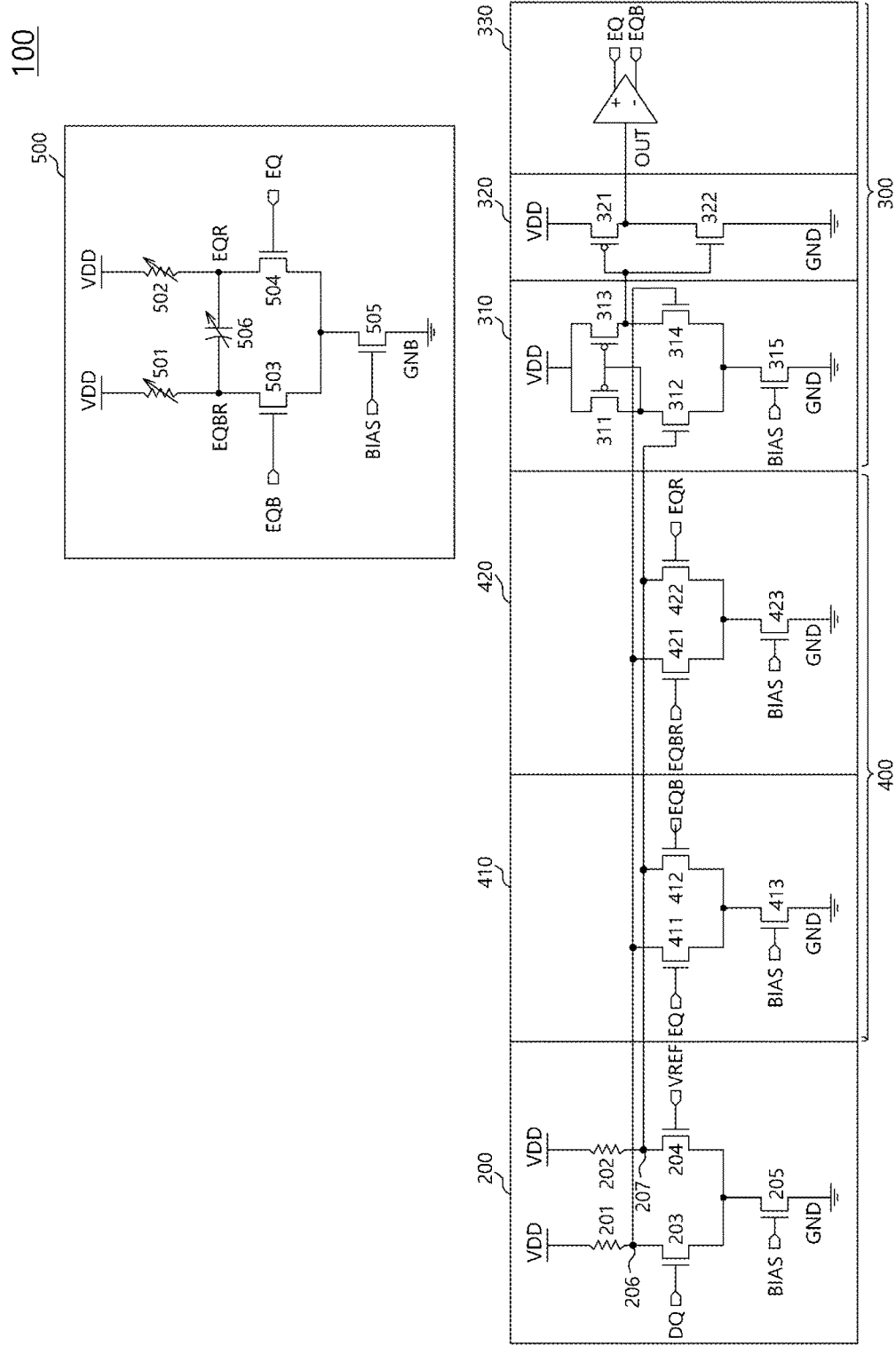
FIG. 3 is a circuit diagram illustrating a representation of an example of a buffer 100 in accordance with an embodiment.

The first buffer 84 of FIG. 2 may be realized in a type, for example, as illustrated in FIG. 3.

Referring to FIG. 3, a buffer 100 in accordance with an embodiment may include a first sensing unit 200, a second sensing unit 300, a noise removal unit 400, and an equalization delay compensation unit 500.

The first sensing unit 200 may be configured to sense data DQ according to a reference voltage VREF.

The second sensing unit 300 may be configured to generate equalization control signals EQ and EQB according to the output of the first sensing unit 200.

The noise removal unit 400 may be configured to primarily remove noise of the output signal of the first sensing unit 200 according to the equalization control signals EQ and EQB and secondarily remove noise of the output signal of the first sensing unit 200 according to delay-compensated equalization control signals EQR and EQBR. The noise removal unit 400 may be coupled between the first sensing unit 200 and the second sensing unit 300 in parallel.

The equalization delay compensation unit 500 may be configured to compensate the equalization control signals EQ and EQB for signal processing delay times of the equalization control signals EQ and EQB, and generate the delay-compensated equalization control signals EQR and EQBR.

The signal processing delay times of the equalization control signals EQ and EQB may correspond to signal processing delay times from the output terminals of the first sensing unit 200 to the output terminals of the second sensing unit 300.

The first sensing unit 200 may include first and second resistors 201 and 202, and first to third transistors 203 to 205.

Respective one ends of the first and second resistors 201 and 202 may be coupled with a power supply terminal VDD.

The first transistor 203 may have a drain coupled with the other end of the first resistor 201, and a gate which is inputted with the data DQ.

The second transistor 204 may have a drain coupled with the other end of the second resistor 202, and a gate which is inputted with the reference voltage VREF.

The third transistor 205 may have a drain coupled in common with sources of the first and second transistors 203 and 204, a gate configured to be applied with a bias voltage BIAS, and a source coupled with a ground terminal GND.

Output signals may be generated from a first node 206 where the first resistor 201 and the first transistor 203 are coupled and a second node 207 where the second resistor 202 and the second transistor 204 are coupled.

The second sensing unit 300 may include an amplification section 310, a slicer 320, and a driver 330.

The amplification section 310 may amplify the outputs of the first sensing unit 200.

The amplification section 310 may include first to fifth transistors 311 to 315.

The first transistor 311 may have a source coupled with the power supply terminal VDD, and a gate coupled with a drain of the first transistor 311.

The second transistor 312 may have a source coupled with the drain of the first transistor 311, and a gate to which the second node 207 of the first sensing unit 200 is coupled.

The third transistor 313 may have a source coupled with the power supply terminal VDD, and a gate coupled with the gate of the first transistor 311.

The fourth transistor 314 may have a source coupled with a drain of the third transistor 313, and a gate to which the first node 206 of the first sensing unit 200 is coupled.

The fifth transistor 315 may have a source coupled in common with a drain of the second transistor 312 and a drain of the fourth transistor 314, a drain coupled with the ground terminal GND, and a gate to which the bias voltage BIAS is applied.

An output signal may be generated from a node where the drain of the third transistor 313 and the source of the fourth transistor 314 are coupled.

The slicer 320 may convert the output of the amplification section 310 into a level capable of being processed inside a semiconductor apparatus, for example but not limited to, a CMOS level, and generate an output signal OUT.

The slicer 320 may be configured by an inverter including first and second transistors 321 and 322.

The driver 330 may drive the output signal OUT of the slicer 320, and output the equalization control signals EQ and EQB of a differential signal type.

The noise removal unit 400 may include a first filter 410 and a second filter 420.

The first filter 410 may be configured to primarily remove noise of the output signals of the first sensing unit 200, for example, portions of ISI, according to the equalization control signals EQ and EQB.

The second filter 420 may be configured to secondarily remove residual noise not removed by the first filter 410 which primarily removes noise of the output signals of the first sensing unit 200, that is, tail ISI, according to the delay-compensated equalization control signals EQR and EQBR.

The first filter 410 may include a 1-tap FIR (finite impulse response) filter.

The first filter 410 may include first to third transistors 411 to 413.

The first transistor 411 may have a drain coupled with the first node 206 of the first sensing unit 200, and a gate configured to be inputted with the equalization control signal EQ between the equalization control signals EQ and EQB.

The second transistor 412 may have a drain coupled with the second node 207 of the first sensing unit 200, and a gate configured to be inputted with the equalization control signal EQB between the equalization control signals EQ and EQB.

The third transistor 413 may have a source coupled with the ground terminal GND, a gate configured to be applied with the bias voltage BIAS, and a drain coupled in common with sources of the first and second transistors 411 and 412.

The second filter 420 may include an IIR (infinite impulse response) filter.

The second filter 420 may include first to third transistors 421 to 423.

The first transistor 421 may have a drain coupled with the first node 206 of the first sensing unit 200, and a gate configured to be inputted with the delay-compensated equalization control signal EQRB between the delay-compensated equalization control signals EQR and EQBR.

The second transistor 422 may have a drain coupled with the second node 207 of the first sensing unit 200, and a gate configured to be inputted with the delay-compensated equalization control signal EQR between the delay-compensated equalization control signals EQR and EQBR.

The third transistor 423 may have a source coupled with the ground terminal GND, a gate configured to be applied with the bias voltage BIAS, and a drain coupled in common with sources of the first and second transistors 421 and 422.

The equalization delay compensation unit 500 may include first and second variable resistors 501 and 502, first to third transistors 503 to 505, and a variable capacitor 506.

Respective one ends of the first and second variable resistors 501 and 502 may be coupled with the power supply terminal VDD.

The first transistor 503 may have a drain coupled with the other end of the first variable resistor 501, and a gate configured to be inputted with any one differential signal EQB between the equalization control signals EQ and EQB.

The second transistor 504 may have a drain coupled with the other end of the second variable resistor 502, and a gate configured to be inputted with the other differential signal EQ between the equalization control signals EQ and EQB.

The third transistor 505 may have a drain coupled in common with sources of the first and second transistors 503 and 504, a gate configured to be applied with the bias voltage BIAS, and a source coupled with the ground terminal GND.

The delay-compensated equalization control signal EQRB between the delay-compensated equalization control signals EQR and EQBR may be outputted through a node where the first variable resistor 501 and the first transistor 503 are coupled.

The delay-compensated equalization control signal EQR between the delay-compensated equalization control signals EQR and EQBR may be outputted through a node where the second variable resistor 502 and the second transistor 504 are coupled.

The variable capacitor 506 may be coupled between the node where the first variable resistor 501 and the first transistor 503 are coupled and the node where the second variable resistor 502 and the second transistor 504 are coupled.

By controlling the resistance values of the first and second variable resistors 501 and 502 and the capacitance value of the variable capacitor 506, it may be possible to cause the signal processing delay times of the equalization delay compensation unit 500 to be the same as the signal processing delay times from the output terminals of the first sensing unit 200 to the output terminals of the second sensing unit 300.

As aforementioned above, in a semiconductor apparatus of a matched delay type, since circuit design is implemented such that the data DQ and the data strobe signal DQS are provided at the same time to the latch block 88 and/or provided with the same timing to the latch block 88, it may be difficult to apply an IIR filter to an input buffer.

However, as described above, since equalization delay compensation is performed by the equalization delay compensation unit 500, the buffer 100 in accordance with the embodiments may be applied with an IIR filter and remove ISI including tail ISI.

Operations of the buffer 100 configured, for example, as mentioned above will be described below.

The first sensing unit 200 senses the data DQ according to the reference voltage VREF, and generates output signals through the first node 206 and the second node 207.

The first filter 410 of the noise removal unit 400, that is for example, the 1-tap FIR filter may remove noise of the output signals of the first sensing unit 200, that is, a partial component of ISI, within a predetermined period, for example, a unit interval (UI), according to the equalization control signals EQ and EQB.

The unit interval (UI) may mean a unit data output time.

The second filter 420 of the noise removal unit 400, that is, the IIR filter may remove the residual component of ISI, that is, tail ISI, within the unit interval (UI) after the operation of the first filter 410, according to the delay-compensated equalization control signals EQR and EQBR.

The second sensing unit 300 may feed back the equalization control signals EQ and EQB which are generated by sensing the output signals of the first sensing unit 200 and converting them to, for example, CMOS levels, to the noise removal unit 400.

Figure 4:
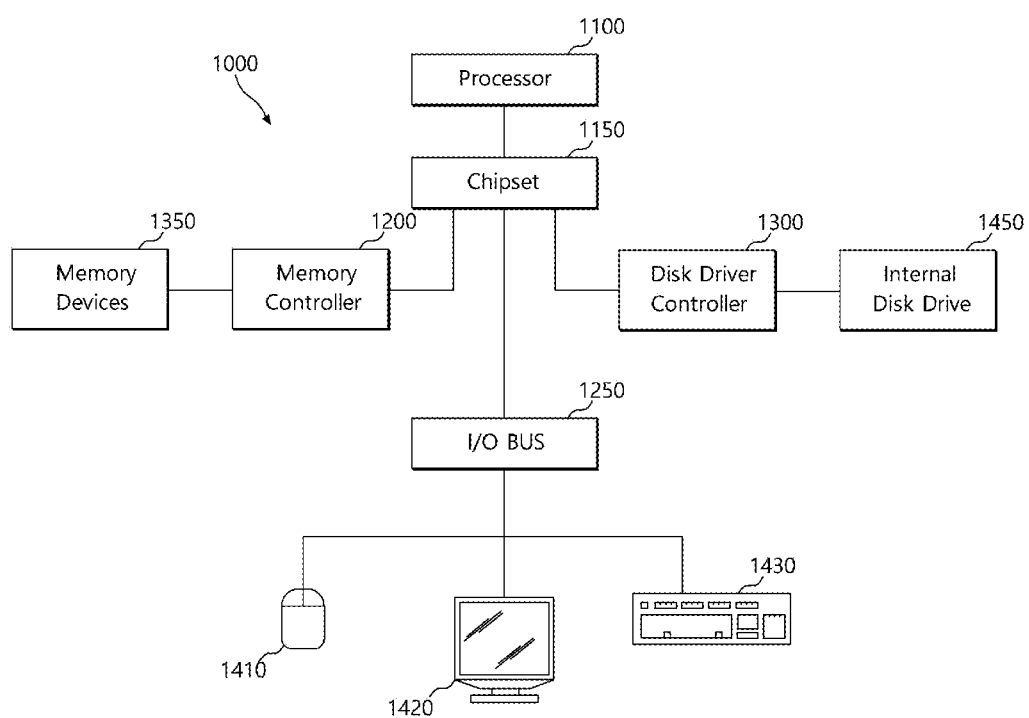
FIG. 4 illustrates a block diagram of an example of a representation of a system employing a buffer, semiconductor apparatus, and/or semiconductor system in accordance with the various embodiments discussed above with relation to FIGS. 1-3.

The buffer, semiconductor apparatus, and/or semiconductor system discussed above (see FIGS. 1-3) are particular useful in the design of memory devices, processors, and computer systems. For example, referring to FIG. 4, a block diagram of a system employing a buffer, semiconductor apparatus, and/or semiconductor system in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one buffer, semiconductor apparatus, and/or semiconductor system as discussed above with reference to FIGS. 1-3. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one buffer, semiconductor apparatus, and/or semiconductor system as discussed above with relation to FIGS. 1-3, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 4 is merely one example of a system 1000 employing a buffer, semiconductor apparatus, and/or semiconductor system as discussed above with relation to FIGS. 1-3. In alternate embodiments, such as, for example but not limited to, cellular phones or digital cameras, the components may differ from the embodiments illustrated in FIG. 4.

While various embodiments have been described above, it will be understood to those skilled in the art that the embodiments described are examples only. Accordingly, the system, the buffer, the semiconductor apparatus and the semiconductor system using the same described herein should not be limited based on the described embodiments.

What is claimed is:

1. A buffer of a semiconductor apparatus comprising:
   a first sensing unit configured to sense data input from an outside of the semiconductor apparatus;
   a second sensing unit configured to generate equalization control signals according to outputs of the first sensing unit;
   an equalization delay compensation unit configured to generate delay-compensated equalization control signals by compensating the equalization control signals for signal processing delay times of the equalization control signals; and
   a noise removal unit configured to primarily remove noise of the output signals of the first sensing unit according to the equalization control signals, and secondarily remove noise of the output signals of the first sensing unit according to the delay-compensated equalization control signals,
   wherein the noise removal unit is coupled between the first sensing unit and the second sensing unit in parallel.

2. The buffer according to claim 1, wherein the signal processing delay times of the equalization control signals correspond to signal processing delay times from output terminals of the first sensing unit to output terminals of the second sensing unit.

3. The buffer according to claim 1, wherein the second sensing unit comprises:
   an amplification section configured to amplify the outputs of the first sensing unit;
   a slicer configured to convert an output of the amplification section into a level capable of being processed inside a semiconductor apparatus; and
   a driver configured to drive an output of the slicer, and output the equalization control signals.

4. The buffer according to claim 1, wherein the equalization delay compensation unit comprises:
   first and second variable resistors having respective one ends coupled with a power supply terminal;
   a first transistor coupled with the first variable resistor, and having a gate configured to receive any one of the equalization control signals;
   a second transistor coupled with the second variable resistor, and having a gate configured to receive the other one of the equalization control signals; and
   a variable capacitor coupled between a node where the first variable resistor and the first transistor are coupled and a node where the second variable resistor and the second transistor are coupled.

5. The buffer according to claim 1,
   wherein the equalization delay compensation unit comprises:
   first and second variable resistors having respective one ends coupled with a power supply terminal;
   a first transistor coupled with the first variable resistor, and having a gate configured to receive any one of the equalization control signals;
   a second transistor coupled with the second variable resistor, and having a gate configured to receive the other one of the equalization control signals; and
   a variable capacitor coupled between a node where the first variable resistor and the first transistor are coupled and a node where the second variable resistor and the second transistor are coupled, and
   wherein the equalization delay compensation unit is configured to compensate the equalization control signals for the signal processing delay times of the equalization control signals, by controlling resistance values of the first and second variable resistors and a capacitance value of the variable capacitor.

6. The buffer according to claim 1, wherein the noise removal unit comprises:
a first filter configured to primarily remove noise of the output signals of the first sensing unit, according to the equalization control signals; and
a second filter configured to secondarily remove noise of the output signals of the first sensing unit, according to the delay-compensated equalization control signals.

7. The buffer according to claim 1, wherein the noise removal unit comprises:
a finite impulse response (FIR) filter configured to primarily remove a portion of intersymbol interference (ISI) of the output signals of the first sensing unit, according to the equalization control signals; and
a infinite impulse response IIR filter configured to secondarily remove a residual component of the ISI of the output signals of the first sensing unit, according to the delay-compensated equalization control signals.

8. The buffer according to claim 7, wherein the FIR filter comprises a 1-tap FIR filter.

9. A semiconductor apparatus comprising:
a core block including a cell array;
a first buffer configured to sense data input from an outside of the semiconductor apparatus, primarily remove noise of sensed signals according to equalization control signals, and secondarily remove noise of the sensed signals according to delay-compensated equalization control signals;
a data path coupled with the first buffer;
a second buffer configured to sense a data strobe signal;
a strobe signal path coupled with the second buffer;
a latch block configured to latch data having passed through the data path, according to the data strobe signal having passed through the strobe signal path, and provide resultant data to the core block, and
the first buffer further comprising:
a noise removal unit;
a first sensing unit; and
a second sensing unit,
wherein the noise removal unit is coupled between the first sensing unit and the second sensing unit in parallel.

10. The semiconductor apparatus according to claim 9, wherein the semiconductor apparatus is a matched delay type in which respective delay times of the data path and the strobe signal path are controlled such that the data and the data strobe signal are provided to the latch block at the same time.

11. The semiconductor apparatus according to claim 9, wherein the first buffer includes an IIR (infinite impulse response) filter and is configured to perform an equalization function by using an IIR filter.

12. The semiconductor apparatus according to claim 9, wherein the first buffer comprises:
a first sensing unit configured to sense the data;
a second sensing unit configured to generate the equalization control signals according to outputs of the first sensing unit;
an equalization delay compensation unit configured to generate the delay-compensated equalization control signals by compensating the equalization control signals for signal processing delay times of the equalization control signals; and
a noise removal unit configured to primarily remove noise of the output signals of the first sensing unit according to the equalization control signals, and secondarily remove noise of the output signals of the first sensing unit according to the delay-compensated equalization control signals,
wherein the noise removal unit is coupled between the first sensing unit and the second sensing unit in parallel.

13. The semiconductor apparatus according to claim 12, wherein the signal processing delay times of the equalization control signals correspond to signal processing delay times from output terminals of the first sensing unit to output terminals of the second sensing unit.

14. The semiconductor apparatus according to claim 12, wherein the equalization delay compensation unit comprises:
first and second variable resistors having respective one ends coupled with a power supply terminal;
a first transistor coupled with the first variable resistor, and having a gate configured to receive any one of the equalization control signals;
a second transistor coupled with the second variable resistor, and having a gate configured to receive the other one of the equalization control signals; and
a variable capacitor coupled between a node where the first variable resistor and the first transistor are coupled and a node where the second variable resistor and the second transistor are coupled.

15. The semiconductor apparatus according to claim 12, wherein the equalization delay compensation unit comprises:
first and second variable resistors having respective one ends coupled with a power supply terminal;
a first transistor coupled with the first variable resistor, and having a gate configured to receive any one of the equalization control signals;
a second transistor coupled with the second variable resistor, and having a gate configured to receive the other one of the equalization control signals; and
a variable capacitor coupled between a node where the first variable resistor and the first transistor are coupled and a node where the second variable resistor and the second transistor are coupled, and
wherein the equalization delay compensation unit is configured to compensate the equalization control signals for the signal processing delay times of the equalization control signals, by controlling resistance values of the first and second variable resistors and a capacitance value of the variable capacitor.

16. The semiconductor apparatus according to claim 12, wherein the noise removal unit comprises:
a first filter configured to primarily remove noise of the output signals of the first sensing unit, according to the equalization control signals; and
a second filter configured to secondarily remove noise of the output signals of the first sensing unit, according to the delay-compensated equalization control signals.

17. The semiconductor apparatus according to claim 12, wherein the noise removal unit comprises:
a finite impulse response (FIR) filter configured to primarily remove a portion of inter symbol interference (ISI) of the output signals of the first sensing unit, according to the equalization control signals; and
a infinite impulse response (IIR) filter configured to secondarily remove a residual component of the ISI of the output signals of the first sensing unit, according to the delay-compensated equalization control signals.

18. The semiconductor apparatus according to claim 17, wherein the FIR filter comprises a 1-tap FIR filter.

19. A buffer of a semiconductor apparatus comprising:
a first sensing unit configured to sense data input from an outside of the semiconductor apparatus;
a second sensing unit configured to generate equalization control signals according to outputs of the first sensing unit;
an equalization delay compensation unit configured to generate delay-compensated equalization control signals by compensating the equalization control signals for signal processing delay times of the equalization control signals; and
a noise removal unit configured to remove noise of the output signals of the first sensing unit according to the equalization control signals and the delay-compensated equalization control signals,
wherein the noise removal unit is coupled between the first sensing unit and the second sensing unit in parallel.

20. The buffer according to claim 19, wherein the equalization delay compensation unit comprises:
first and second variable resistors having respective one ends coupled with a power supply terminal;
a variable capacitor coupled between other ends of the first and second variable resistors, and
wherein the equalization delay compensation unit is configured to compensate the equalization control signals for the signal processing delay times of the equalization control signals, by controlling resistance values of the first and second variable resistors and a capacitance value of the variable capacitor.

21. The buffer according to claim 19, wherein the noise removal unit first removes noise of the output signals of the first sensing unit with a first filter and then secondarily removes noise of the output signals of the first sensing unit with a second filter.

* * * * *